(12) United States Patent
Jiang et al.

(10) Patent No.: US 11,652,051 B2
(45) Date of Patent: May 16, 2023

(54) CONTACT STRUCTURE AND ELECTRONIC DEVICE HAVING THE SAME

(71) Applicant: TPK Advanced Solutions Inc., Fujian (CN)

(72) Inventors: Yi-Min Jiang, Xiamen (CN); Xi-Zhao Wang, Dengzhou (CN); Li-Wei Mu, Guyuan (CN); Shan-Yu Wu, New Taipei (TW); Chih-Min Chen, Taichung (TW); Chao-Hui Kuo, Taipei (TW); Wei-Chuan Chao, New Taipei (TW); Chia Jui Lin, Taoyuan County (TW)

(73) Assignee: TPK Advanced Solutions Inc., Fujian (CN)

(*) Notice: Subject to any disclaimer, the term of this patent is extended or adjusted under 35 U.S.C. 154(b) by 170 days.

(21) Appl. No.: 17/155,943

(22) Filed: Jan. 22, 2021

(65) Prior Publication Data

US 2022/0238749 A1    Jul. 28, 2022

(51) Int. Cl.
| | |
|---|---|
| *H01L 23/532* | (2006.01) |
| *H01L 31/18* | (2006.01) |
| *G06F 3/044* | (2006.01) |
| *G06F 3/041* | (2006.01) |
| *H01B 1/08* | (2006.01) |

(52) U.S. Cl.
CPC ...... *H01L 23/53238* (2013.01); *G06F 3/0412* (2013.01); *G06F 3/0443* (2019.05); *G06F 3/0445* (2019.05); *G06F 3/0446* (2019.05); *G06F 3/04164* (2019.05); *H01L 23/53252* (2013.01); *H01L 31/1888* (2013.01); *G06F 2203/04103* (2013.01); *H01B 1/08* (2013.01)

(58) Field of Classification Search
None
See application file for complete search history.

(56) References Cited

U.S. PATENT DOCUMENTS

| | | | |
|---|---|---|---|
| 11,360,622 B2 * | 6/2022 | Hsiao | G06F 3/0445 |
| 2014/0287639 A1 * | 9/2014 | Lee | H01B 1/22 |
| | | | 442/376 |

FOREIGN PATENT DOCUMENTS

| | | | | |
|---|---|---|---|---|
| CN | 106104706 A | * | 11/2016 | H01B 1/22 |
| TW | 201901700 A | | 1/2019 | |

OTHER PUBLICATIONS

English text machine translation of Hwang et al. (CN 106104706 A) Description and Claims, accessed online from Espacenet; see attached PDF pp. 1-35. (Year: 2016).*

* cited by examiner

*Primary Examiner* — Katie L. Hammer
(74) *Attorney, Agent, or Firm* — Cooper Legal Group, LLC

(57) ABSTRACT

The present disclosure provides a contact structure and an electronic device having the same. The contact structure includes: a substrate; a copper layer disposed on the substrate; an adhesion promotion layer disposed on the copper layer, wherein the adhesion promotion layer forms a monomolecular adsorption layer on the surface of the copper layer; and a silver nanowire layer disposed on the adhesion promotion layer, and the adhesive force between the copper layer and the silver nanowire layer is 3B or more. In the present disclosure, by disposing the adhesion promotion layer on the copper layer, in the stacked structure of the copper layer and the silver nanowire layer, the adhesive force between the copper layer and the silver nanowire layer is increased, so as to prevent a peeling phenomenon of the copper layer occurring in the subsequent yellow-light process.

13 Claims, 7 Drawing Sheets

CONTACT STRUCTURE AND ELECTRONIC DEVICE HAVING THE SAME

BACKGROUND

1. Field of the Disclosure

The present disclosure relates to a contact structure and an electronic device having the same, and more particularly, to a contact structure with a stacked copper layer and silver nanowire layer, and an electronic device having the same.

2. Description of Related Art

In the related art, in some electronic devices (such as touch panels), in a contact area where a touch electrode and a transmission line meet, a copper material layer is mostly used as the material of the transmission line, and a silver nanowire layer is used as the touch electrode. However, there is a problem of poor adhesion at the contact surface of the above-mentioned materials, and in the process of manufacturing the device including this contact area (such as yellow-light process, etc.), due to an effect of the stripping solution (for example, tetramethylammonium hydroxide (TMAH) solution), it is difficult to control the adhesion between the copper and the silver.

FIG. 1A shows a schematic diagram of a device 10 including a contact area 20 in the related art before being treated with a stripping solution of the yellow-light process. The device 10 includes a substrate 12, a copper layer 14 disposed on the substrate 12, and a silver nanowire layer 16 disposed on the substrate 12 and partially covering the copper layer 14. FIG. 1B shows a schematic diagram of the device 10 of FIG. 1A after being treated with a stripping solution of the yellow-light process. It is easy for a peeling phenomenon to occur between the copper layer 14' and the silver nanowire layer 16 at the contact area 20 after the yellow-light process. An adhesive force is measured by a test method for rating adhesion by tape (e.g., ASTM D3359), and the test result is 0B.

Since the adhesion between the copper layer 14' and the silver nanowire layer 16 will affect the reliability of the product, the contact structure between the silver nanowire layer and the copper layer in the related art needs to be improved.

SUMMARY

An objective of an embodiment of the present disclosure is to provide a contact structure, wherein by disposing an adhesion promotion layer on a copper layer, in a stacked structure of the copper layer and a silver nanowire layer, an adhesive force between the copper layer and the silver nanowire layer is increased, so as to prevent the peeling phenomenon of the copper layer that occurs in the subsequent yellow-light process. Another objective of an embodiment of the present disclosure is to provide an adhesion promotion layer, wherein in the stacked structure of the copper layer and the silver nanowire layer, the adhesive force between the copper layer and the silver nanowire layer is increased, so as to prevent the peeling phenomenon of the copper layer from occurring in the subsequent yellow-light process. Yet another objective of an embodiment of the present disclosure is to provide an adhesion promotion layer, such that the contact surface between the silver nanowire layer and the copper layer has chemical resistance, thereby during the production process, the product can maintain the adhesive force between the copper layer and the silver nanowire layer without being affected by chemicals.

An embodiment of the present disclosure provides a contact structure, including a substrate, a copper layer, an adhesion promotion layer, and a silver nanowire layer. The copper layer is disposed on the substrate. The adhesion promotion layer is disposed on the copper layer, wherein the adhesion promotion layer forms a monomolecular adsorption layer on a surface of the copper layer. The silver nanowire layer is disposed on the adhesion promotion layer. The adhesive force between the copper layer and the silver nanowire layer is 3B or more.

In an embodiment, the adhesion promotion layer is an organic layer formed by curing a composite formulated organic coating material, and the composite formulated organic coating material includes 0.05 wt% to 10 wt% of a base solution, 0.05 wt% to 10 wt% of an additive and 80 wt% to 99.8 wt% of a solvent.

The base solution is a first coupling agent, the additive is a second coupling agent, an organic ligand, an organic resin, or a combination thereof, and the first coupling agent is different from the second coupling agent.

In an embodiment, a ratio of the base solution to the additive is 1:4 to 10:1.

In an embodiment, the adhesion promotion layer has a thickness of about 50 nm to about 100 nm.

In an embodiment, the contact structure has an adhesive force of 3B to 5B measured after being soaked in tetramethylammonium hydroxide. In an embodiment, the contact structure has an adhesive force of 3B to 4B measured after being soaked in tetramethylammonium hydroxide.

An embodiment of the present disclosure provides an electronic device, including a contact structure formed by a copper layer and a silver nanowire layer.

In an embodiment, the contact structure of the electronic device is located in a peripheral area of the electronic device.

BRIEF DESCRIPTION OF THE DRAWINGS

The various aspects of the present disclosure will be most easily understood when the following detailed description is read in conjunction with the accompanying drawings. It should be noted that, according to industry standard operating procedures, various feature structures may not be drawn to scale. In fact, for clarity of discussion, the sizes of various feature structures can be increased or decreased arbitrarily.

DETAILED DESCRIPTION

Figure 1A:
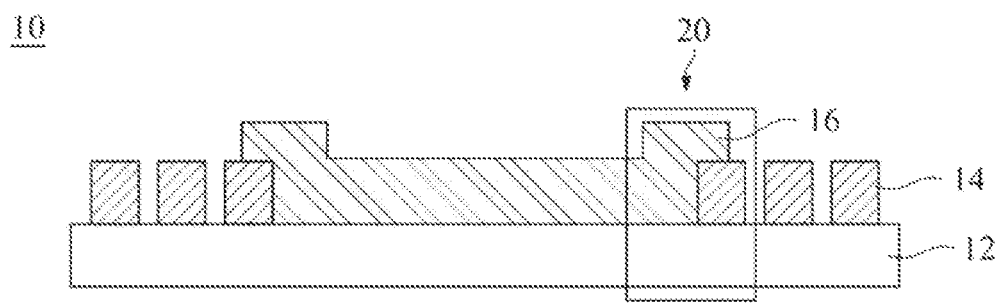
FIG. 1A shows a schematic diagram of a device including a contact structure in the related art before being treated with a stripping solution of a yellow-light process.
Figure 1B:
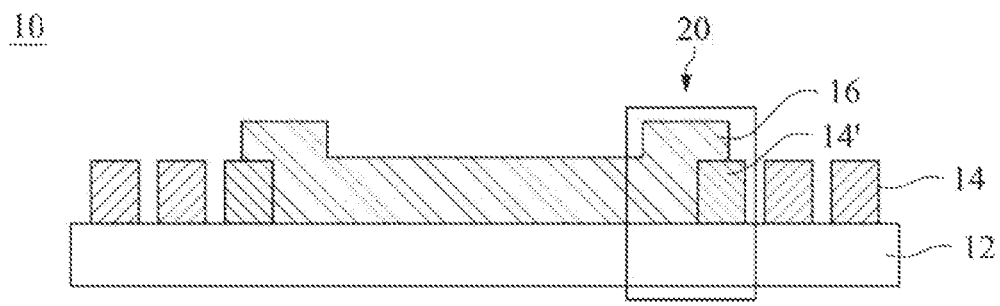
FIG. 1B shows a schematic diagram of the device including the contact structure in the related art after being treated with the stripping solution of the yellow-light process.

The following disclosure provides different embodiments or examples to achieve different features of the above objectives. Specific embodiments of components and configurations are described below to simplify the present disclosure. These are of course examples only and are not intended to limit the present disclosure. For example, in the following description, the first feature is formed to be higher than the second feature, wherein an embodiment, in which the first and second features are formed to directly contact with each other, can be included; in addition, an embodiment, in which additional features are provided between the first and second features and thus the first and second features are not formed to directly contact with each other, can be included. In addition, in the present disclosure, numbers and/or letters may be repeatedly used as reference numeral in each embodiment. Such repetition does not refer to the relationship between individual embodiments and/or configurations discussed.

Further, in order to facilitate the description of the relationship between one element or feature and another element or feature as shown in the drawings, relative spatial terms, such as "below", "under", "lower", "on", "above", "higher", and the like may be used here. In addition to the directions shown in the drawings, the relative spatial terms are intended to contain different directions of the device in use or in operation. The device can be oriented in other directions (such as being rotated by 90 degrees or other directions), which can also be interpreted correspondingly by the spatial relative terms used here.

Figure 2A:
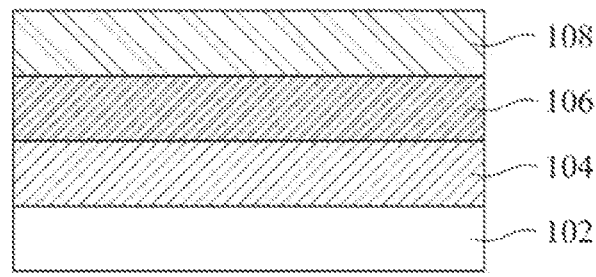
FIG. 2A shows a schematic cross-sectional view of a contact structure according to an embodiment of the present disclosure.

Refer to FIG. 2A, which shows a contact structure 100 according to an embodiment of the present disclosure. The contact structure 100 includes a substrate 102, a copper layer 104, an adhesion promotion layer 106, and a silver nanowire layer 108. The copper layer 104 is disposed on the substrate 102. The adhesion promotion layer 106 is disposed on the copper layer 104. The silver nanowire layer 108 is disposed on the adhesion promotion layer 106. In other words, the adhesion promotion layer 106 is disposed between the copper layer 104 and the silver nanowire layer 108, which does not affect the electrical connection between the copper layer 104 and the silver nanowire layer 108 and allows a better adhesion/binding ability between the copper layer 104 and the silver nanowire layer 108, thereby reducing the peeling risk of the silver nanowire layer 108. In addition, in the subsequent process, the adhesion promotion layer 106 has an excellent performance in ultraviolet (UV) resistance and/or chemical resistance (such as alkaline chemical liquid resistance), and thus is suitable for the yellow-light process.

Figure 2B:
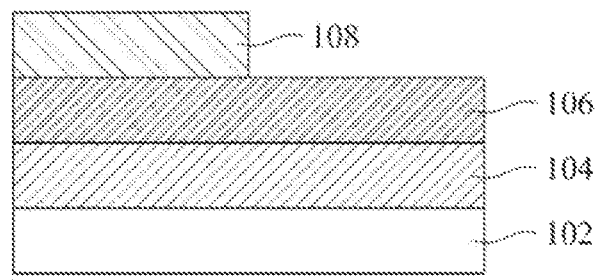
FIG. 2B shows a schematic cross-sectional view of a contact structure according to another embodiment of the present disclosure.

In another embodiment, as shown in FIG. 2B, the silver nanowire layer 108 partially covers the copper layer 104. In other words, a part of the copper layer 104 indirectly contacts the silver nanowire layer 108 via the adhesion promotion layer 106, and there is no silver nanowire layer 108 covering the remaining part of the copper layer 104.

In an embodiment of the present disclosure, the adhesion promotion layer 106 in the contact structure 100 is an extremely thin organic layer formed by curing a composite formulated organic coating material, and the composite formulated organic coating material includes a base solution (0.05 wt% to 10 wt%), an additive (0.05 wt% to 10 wt%), and a solvent (80 wt% to 99.8 wt%). The base solution is a first coupling agent, and the additive is a second coupling agent, an organic ligand, an organic resin, or a combination thereof. The first coupling agent is different from the second coupling agent, and the first coupling agent and the second coupling agent can be an amine-based silane coupling agent, an epoxy-based silane coupling agent, a modified coupling agent or the like, respectively. The solvent can be water or organic solvents such as alcohols, ethers, esters, etc.

A silane coupling agent is a widely used coupling agent. However, in the present disclosure, when a single component coupling agent was used and an adhesion test was performed, it was found that a stable adhesion state cannot be formed between the copper layer 104 and the silver nanowire layer 108, and the peeling/adhesion strength was only 0B to 2B.

In an embodiment, the adhesion promotion layer 106 can form a monomolecular adsorption layer on a surface of a metal, so as to improve the adhesion effect between the metal (e.g., the copper layer 104) and silver nanowires (e.g., of the silver nanowire layer 108).

In an embodiment, the adhesion promotion layer 106 has a thickness of about 50 nm to about 100 nm, such as 50, 60, 70, 80, 90, or 100 nm.

In one embodiment, the contact structure 100 of the present disclosure can be widely used at the location where the copper layer 104 and the silver nanowire layer 108 are stacked and contact with each other. For example, refer to FIG. 3, which shows an element 200 according to another embodiment of the present disclosure. The element 200 includes a contact structure 210. The contact structure 210 includes a substrate 212, a copper layer 214 (wherein a portion of the copper layer 214 indirectly contacting with the silver nanowire layer is denoted as copper layer 214"), an adhesion promotion layer 216, and a silver nanowire layer 218. The contact structure 210 may be the location where a touch electrode and a signal transmission line in a touch panel meet or are overlapped with each other. The silver nanowire layer 218 is used as the touch electrode, the copper layer 214 is used as the signal transmission line, and the contact structure 210 allows a signal of the touch electrode to be transmitted to the signal transmission line. Specifically, the contact structure 210 may be located in a peripheral area of the touch panel or be adjacent to a boundary area between the peripheral area and a visible area. The adhesion promotion layer 216 is located between the copper layer 214" and the silver nanowire layer 218, which does not affect the electrical connection between the copper layer 214" and the silver nanowire layer 218. In addition, even after being treated with a stripping solution (e.g., tetramethyl ammonium hydroxide) in the yellow-light process, the adhesion promotion layer 216 still provides a good adhesion between the copper layer 214" and the silver nanowire layer 218.

Figure 3:
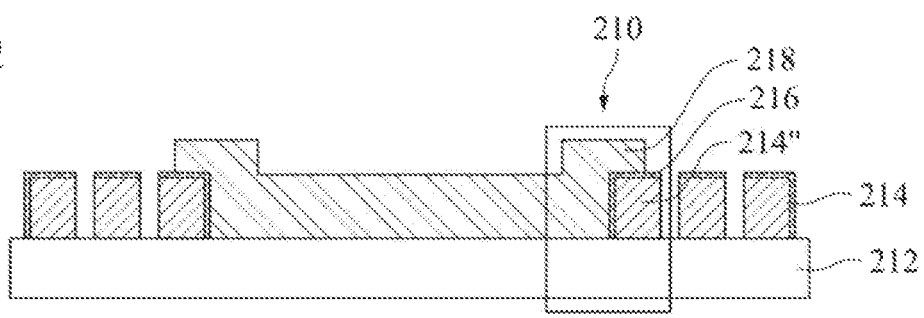
FIG. 3 shows a schematic cross-sectional view of a device according to an embodiment of the present disclosure.

In addition, the upper surface and/or side surfaces of some copper layers 214 may also be covered with the adhesion promotion layer 216, as shown in FIG. 3.

Figure 4:
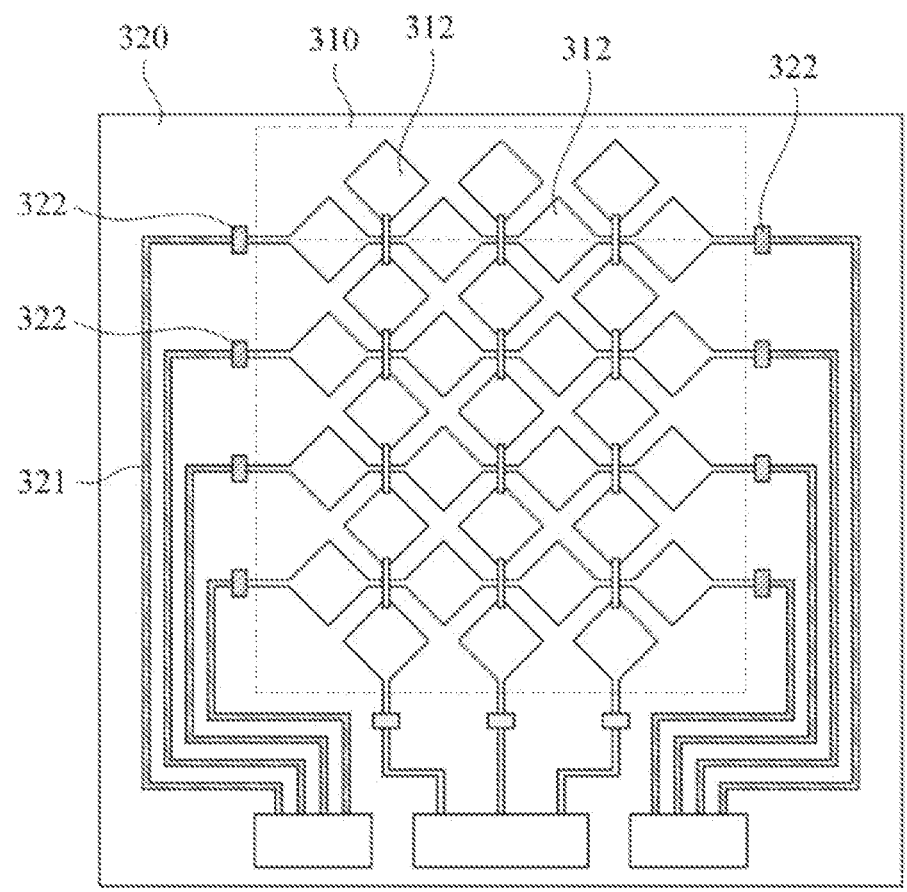
FIG. 4 shows a top view of a touch panel according to an embodiment of the present disclosure.

The contact structure 100 provided in the embodiments of the present disclosure can be applied to display devices, for example, electronic devices with panels, such as mobile phones, tablets, wearable electronic devices (such as smart bracelets, smart watches, virtual reality devices, etc.), TVs, monitors, notebooks, e-books, digital photo frames, navigators, or the like. The element 200 and the touch panel 300 (as shown in FIG. 4) of the embodiments of the present disclosure can be assembled with other electronic elements to form a device/product, such as a display with touch function. For example, the element 200 and the touch panel 300 can be adhered to a display element (not shown), such as a liquid crystal display element or an organic light emitting diode (OLED) display element, and an optical glue or other similar adhesive agents can be used between the element 200 and/or the touch panel 300 and the display element for adhesion. Alternatively, the element 200 and the touch panel 300 can be adhered to an optical film, such as a polarizing plate (stretching type polarizing plate or liquid crystal coating type polarizer), an optical retardation film, etc. The element 200, the touch panel 300, etc. of the embodiments of the present disclosure can be applied to electronic devices such as portable phones, tablet computers, notebook computers, etc., and also can be applied to flexible products. The element 200 and touch panel 300 of the embodiments of the present disclosure can also be used in wearable devices (such as watches, glasses, smart clothes, smart shoes, etc.), automotive devices (such as dashboards, dashcams, automotive rear view mirrors, automotive windows, etc.).

Refer to FIG. 4, which shows a top view of a touch panel 300 in a display device. The touch panel 300 includes a display area 310 and a peripheral area 320. In the display area 310, a touch sensing electrode 312 is formed of a conductive material including nano silver. In the peripheral area 320, a signal transmission line 321 is formed of a layer of copper. The peripheral area 320 includes a plurality of lap joint areas 322, herein the touch sensing electrode 312 is electrically connected to the signal transmission line 321 for signal transmission. The lap joint areas 322 may include the contact structure 210 as shown in FIG. 3.

In one embodiment, in the lap joint areas 322, the silver nanowire layer covers one side surface and part or all of the upper surface of the copper layer of the signal transmission line 321, wherein the adhesion promotion layer is located between the copper layer and the silver nanowire layer.

In one embodiment, a copper layer is formed at the peripheral area 320 on the substrate of the touch panel 300, and then an adhesion promotion layer is disposed on the copper layer. After that, a silver nanowire layer is formed on the display area 310 and the peripheral area 320 on the substrate, and the silver nanowire layer is also formed on the copper layer and the adhesion promotion layer in the peripheral area 320. The patterning process, which includes procedures of coating of a photoresist layer, exposure, development, etching (dry and wet), and the like, is then performed. Therefore, a touch sensing electrode pattern is formed in the display area 310, and a plurality of separated signal transmission lines 321 are formed in the peripheral area 320. In the lap joint areas 322, after being treated with etching, the silver nanowire layer is located on the copper layer, and the adhesion promotion layer is located between the copper layer and the silver nanowire layer. In one embodiment, in the peripheral area 320, the silver nanowire layer, the adhesion promotion layer, and the copper layer have mutually aligned sides (i.e., a common etched surface). The space between the electrode patterns and the space between the signal transmission lines 321 are then filled with an insulating material.

In an alternative embodiment, the silver nanowire layer is not merely formed in the lap joint areas 322, but extends to the entire peripheral area 320, so as to be subjected to one time etching with the copper layer. Alternatively, a process of first etching the silver nanowire layer and adhesion promotion layer, and then etching the copper layer can be performed. Accordingly, the signal transmission lines 321 in the peripheral area 320 are a composite structure of silver nanowire layer/adhesion promotion layer/copper layer. Particularly, refer to FIGS. 5A to 5C in combination with the description of the following disclosure.

Figure 5A:
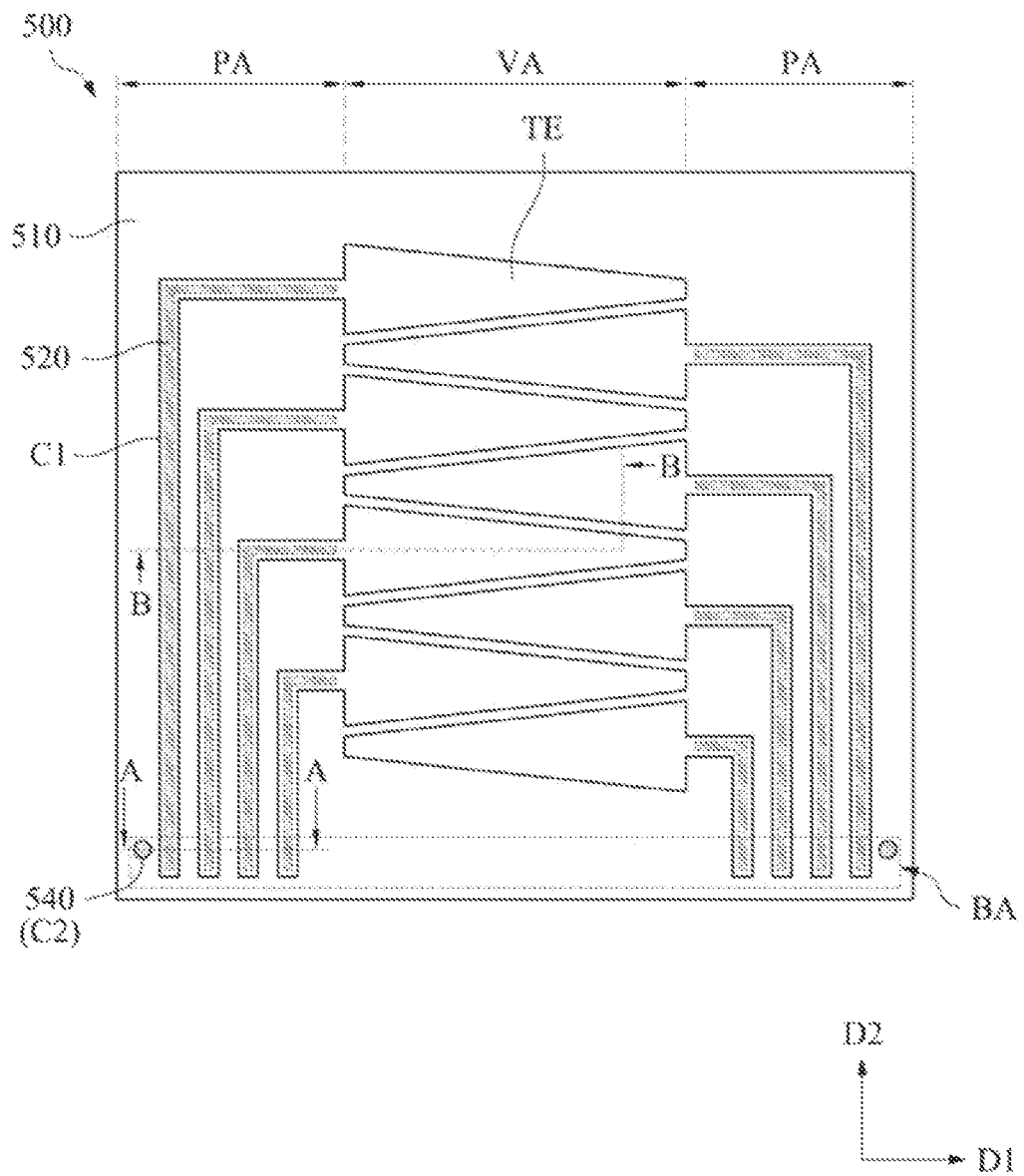
FIG. 5A shows a schematic top view of a touch panel according to an embodiment of the present disclosure.
Figure 5B:
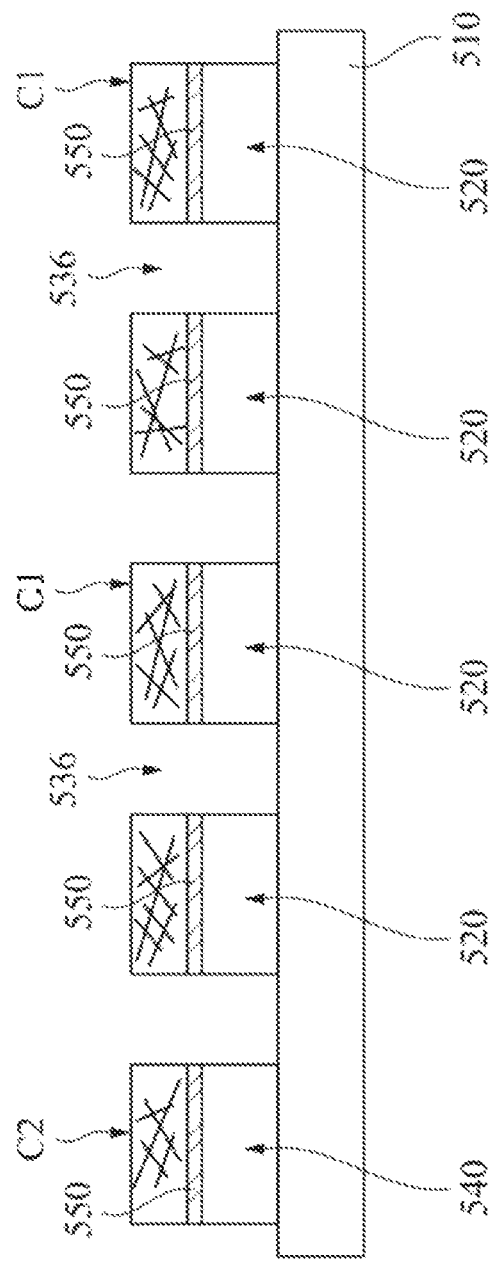
FIG. 5B is a schematic cross-sectional view along line A-A of FIG. 5A.
Figure 5C:
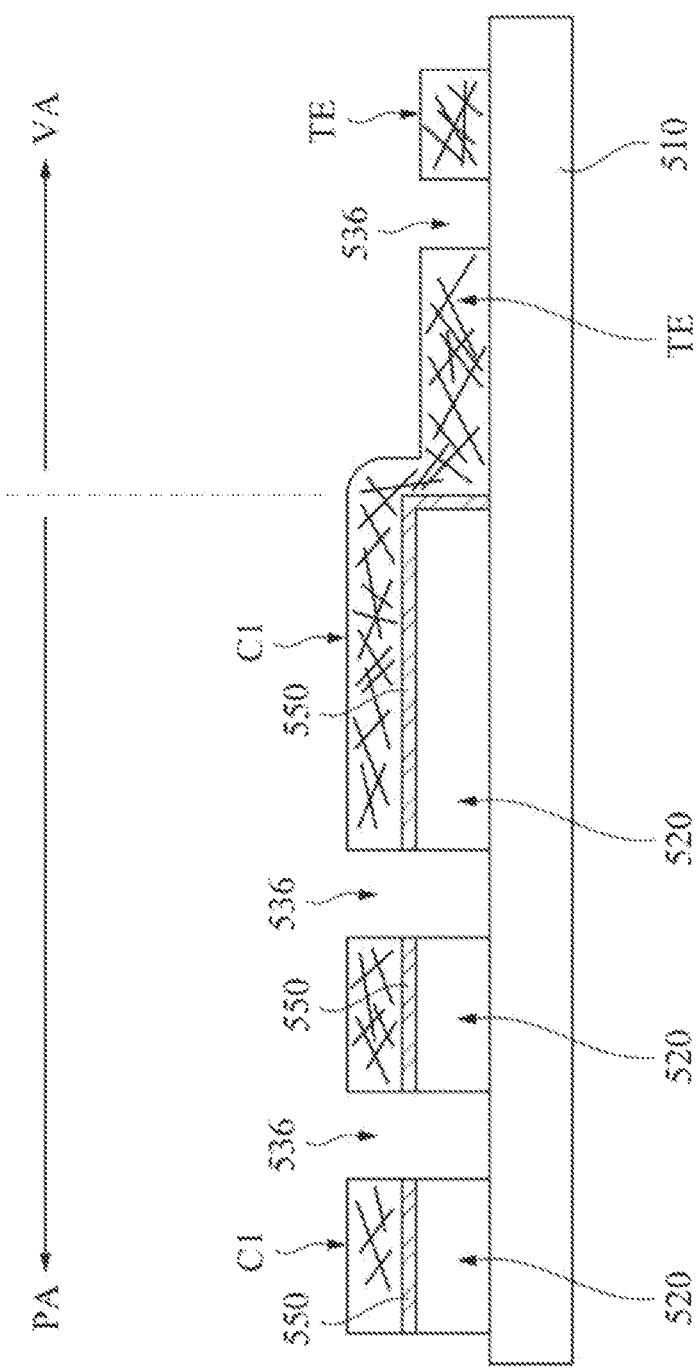
FIG. 5C is a schematic cross-sectional view along line B-B of FIG. 5B.

FIG. 5A shows a schematic top view of a touch panel 500 according to some embodiments of the present disclosure, and FIGS. 5B and 5C are cross-sectional views along lines A-A and B-B of FIG. 5A, respectively. The touch panel 500 includes a substrate 510, a peripheral leading wire 520, a marker 540, a first overlay C1, a second overlay C2, an adhesion promotion layer 550 (referring to FIGS. 5B and 5C), and a touch sensing electrode TE. The numbers of the peripheral leading wire 520, the marker 540, the first overlay C1, the second overlay C2, and the touch sensing electrode TE mentioned above may be one or more, respectively, and their numbers illustrated in the following specific embodiments and the drawings are for the illustrative purpose only and do not intend to limit the present disclosure.

Referring to FIG. 5A, the substrate 510 has a display area VA and a peripheral area PA. The peripheral area PA is disposed at the side of the display area VA. For example, the peripheral area PA can be a frame-shaped area disposed around the display area VA (that is, at the right, left, upper, and lower sides). However, in other embodiments, the peripheral area PA can be an L-shaped area disposed at the left and lower sides of the display area VA. In addition, as shown in FIG. 5A, in this present embodiment, the peripheral area PA of the substrate 510 is provided with a total of eight sets of peripheral leading wires 520 and first overlays C1 corresponding to the peripheral leading wires 520; and the touch sensing electrode TE is disposed in the display area VA of the substrate 510. In this embodiment, the peripheral area PA of the substrate 510 is further provided with two sets of markers 540 and second overlays C2 corresponding to the markers 540. An adhesion promotion layer 550 is disposed between the first overlay C1 and the peripheral leading wire 520, so as to avoid the peripheral leading wire 520 and the first overlay C1 mentioned above from resulting in a redox reaction in a specific environment (such as the above-mentioned stripping solution). The adhesion promotion layer 550 is also disposed between the second overlay C2 and the marker 540. In addition, the first overlay C1 and the second overlay C2 are disposed on the peripheral leading wire 520 and the marker 540, respectively, such that both the upper and lower layers of material are formed in predetermined positions without alignment. Therefore, the requirement for disposing an alignment error area in the manufacturing process can be reduced or omitted, thereby reducing a width of the peripheral area PA, and thus achieving a narrow bezel requirement of the display.

In this embodiment, the touch sensing electrode TE is disposed in the display area VA, and the touch sensing electrode TE can be electrically connected to the peripheral leading wire 520. Particularly, the touch sensing electrode TE can also be a metal nanowire layer (e.g., a silver nanowire layer) including at least metal nanowires. That is, the metal nanowires form the touch sensing electrode TE in the display area VA and form the first overlay C1 in the peripheral area PA, and a thickness/characteristics of the adhesion promotion layer 550 formed as a monomolecular layer does not affect the electrical conduction between the metal layer (e.g., the copper layer) and the metal nanowire layer. Therefore, an electrical connection can be achieved by the touch sensing electrode TE through the contact between the first overlay C1, the adhesion promotion layer 550, and the peripheral leading wire 520, thereby allowing signal transmission. The metal nanowires also form a second overlay C2 in the peripheral area PA, and the second overlay C2 is disposed on the marker 540. The marker 540 can be widely interpreted as a non-electrical function pattern, but the disclosure is not limited thereto. In some embodiments of the present disclosure, the peripheral leading wire 520 and the marker 540 can be made of a same metal layer (that is, the two are made of the same metal material); and the touch sensing electrode TE, the first overlay Cl, and the second overlay C2 can be made of a same metal nanowire layer.

In this embodiment, the marker 540 is disposed in the bonding area BA of the peripheral area PA. The marker 540 is a marker for docking and alignment, that is, a marker for aligning a flexible circuit board (not shown) with the touch panel 500 in a step of connecting an external circuit board, such as the flexible circuit board (not shown) to the touch panel 500 (i.e., a bonding step). However, in the present disclosure, the placement position or function of the marker 540 is not limited. For example, the marker 540 can be any check mark, pattern, or sign required for the manufacturing process, which is within the scope protected by the present disclosure. The marker 540 can have any possible shape, such as a circle shape, quadrilateral shape, cross shape, L-shape, T-shape, etc., and the shape of the adhesion promotion layer 550 is substantially the same as the marker 540.

As shown in FIGS. 5B and 5C, in the peripheral area PA, a non-conductive area 536 is disposed between adjacent peripheral leading wires 520, so as to electrically isolate the adjacent peripheral leading wires 520, thereby avoiding short circuits. In this embodiment, the non-conductive area 536 is a gap for isolating adjacent peripheral leading wires 520. In the patterning step, the above-mentioned gap can be formed by an etching method, so that the sidewall of the peripheral leading wire 520, the sidewall of the adhesion promotion layer 550, and the sidewall of the first overlay C1 form a common etched surface and are aligned with each other. That is, the sidewall of the peripheral leading wire 520, the sidewall of the adhesion promotion layer 550, and the sidewall of the first overlay C1 are formed in a same etching step. Similarly, the sidewall of the marker 540, the sidewall of the adhesion promotion layer 550, and the sidewall of the second overlay C2 form a common etched surface and are aligned with each other. Furthermore, the peripheral leading wire 520, the adhesion promotion layer 550, and the first overlay Cl are the same or similar in patterns and sizes, for example, they are all in long and straight patterns, and are the same or similar in widths.

As shown in FIG. 5C, in the display area VA, a non-conductive area 536 is disposed between adjacent touch sensing electrodes TE, so as to electrically isolate the adjacent touch sensing electrodes TE, thereby avoiding short circuits. In this embodiment, the non-conductive area 536 is a gap for isolating adjacent touch sensing electrodes TE. In one embodiment, the gap between the adjacent touch sensing electrodes TE can be formed by the above-mentioned etching method. In this embodiment, the touch sensing electrode TE and the first overlay Cl can be made of a same metal nanowire layer (such as the silver nanowire layer) so that at the boundary of the display area VA and the peripheral area PA, the metal nanowire layer forms an upslope structure, thereby forming said first overlay Cl.

In one embodiment, the touch sensing electrode TE adopts a double-layer configuration. In other words, the upper and lower surfaces of the substrate are both provided with touch sensing electrodes TE, so that each of the peripheral leading wire 520, the first overlay Cl, and the adhesion promotion layer 550 mentioned above is formed on the upper and lower surfaces of the substrate.

Figure 6A:
FIGS. 6A to 6C show schematic cross-sectional views of different steps of a method for manufacturing a contact structure according to an embodiment of the present disclosure.
Figure 6B:
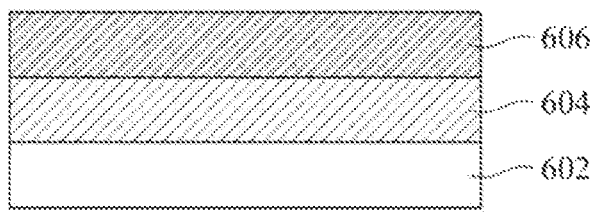
Figure 6C:
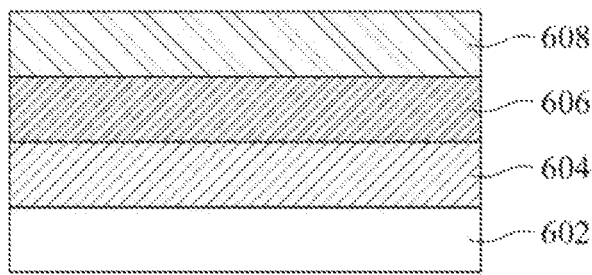

Refer to FIGS. 6A to 6C, which show flowcharts of manufacturing a contact structure according to an embodiment of the present disclosure.

In FIG. 6A, a copper layer 604 is disposed on the substrate 602.

In an embodiment, the substrate 602 may be rigid or flexible. The substrate 602 may be transparent or opaque. Suitable rigid substrates include, for example, polycarbonates, acrylics, and the like. Suitable flexible substrates include, but are not limited to, polyesters (e.g., polyethylene terephthalate (PET), polynaphthalate ester and polycarbonate), polyolefins (e.g., linear, branched, and cyclic polyolefins), polyethylene (e.g., polyvinyl chloride, polyvinylidene chloride, polyvinyl alcohol acetal, polystyrene, polyacrylate, and the like), cellulose-based polymers (e.g., cellulose triacetate and cellulose acetate), polysulfone (e.g., polyethersulfone), polyimide, polysiloxane, or other polymer films.

The copper layer 604 is disposed on the substrate 602. The copper layer 604 may be disposed on the substrate 602 by electroplating, chemical plating, or other deposition methods.

In FIG. 6B, an adhesion promotion layer 606 is disposed on the copper layer 604. In some embodiments, the composite formulated organic coating material can be coated on the copper layer 604. In another embodiment, the structure including the copper layer 604 may be soaked in the above-mentioned composite formulated organic coating material. The composite formulated organic coating material includes a base solution (0.05 wt% to 10 wt%), an additive (0.05 wt% to 10 wt%), and a solvent (80 wt% to 99.8 wt%). In an embodiment, in the composite formulated organic coating material, the content of the base solution and the additive is 0.1 wt% to 1.5 wt%, 0.1 wt% to 1.33 wt%, 0.1 wt% to 1.1 wt%, 0.1 wt% to 1.0 wt%, or 0.1 wt% to 0.5 wt% of the overall weight of the composite formulated organic coating material. In an embodiment, a ratio of the base solution to the additive is 1:4 to 10:1.

In another embodiment, the composite formulated organic coating material includes a silane coupling agent composite solution (i.e., the base solution) and a chelating agent (i.e., the additive). The silane coupling agent composite solution can be an epoxy-based silane coupling agent (general formula: $(R_1\text{-}O)_2\text{-}Si\text{-}R_2\text{-}Y$). Ri is a functional group which can undergo hydrolysis reaction and generate Si-OH, including Cl, OMe (Me is a methyl group), OEt (Et is an ethyl group), $OC_2H_4OCH_3$, OSiMe, etc. $R_2$ is hydrogen atom, methyl group, ethyl group, propyl group, butyl group, phenyl group, cyclohexyl group, vinyl group, propylene group, aminopropyl group, aminoethyl aminopropyl group, mercaptopropyl group, phenylaminomethyl group, etc. Y is a non-hydrolyzable functional group, including chain olefinic functional groups (mainly vinyl functional group) and alkyl groups with terminal functional groups such as Cl, $NH_2$, SH, $N_3$, epoxy group, (methyl)acryloxy group, isocyanate group, etc., that is, carbon functional groups.

The epoxy-based silane coupling agent may include, for example, hexamethyldisiloxane, tetrakis(trimethylsiloxy)silane, 3-glycidoxypropyltrimethoxysilane, or a combination thereof. Depending on the coupling degree, the amine-based silane coupling agent may include monoamino group, diamino group, triamino group, and polyamino group, such as phenylaminomethyltriethoxysilane, phenylaminomethyltrimethoxysilane, aminopropyltrimethoxysilane, their derivative compounds, or a combination thereof.

The organic resin can be polyurethane (PU) based resin, such as polyurethane, 4'-diphenylmethane diisocyanate, or a combination thereof.

The chelating agent is an organic chelating agent, a metal chelating agent, or a combination thereof. The chelating agent may be one or a mixture of ethylenediaminetetraacetic acid (EDTA), ethylenediamine, sodium potassium tartrate, etc.

In one embodiment, the content of the epoxy-based silane coupling agent is about 0.05 to about 10 wt% of the composite formulated organic coating material, and the content of the chelating agent is about 0.05 to about 10 wt% of the composite formulated organic coating material. A ratio of the epoxy-based silane coupling agent to the chelating agent is 1:100 to 100:1, such as 1:1 to 10:1, 1:1 to 6:1, 3:1 to 10:1, 3:1 to 6:1, or the like.

In FIG. 6B, a step of forming a protective layer solution into an adhesion promotion layer 606 is further included. In one embodiment, a drying treatment is performed by, for example, air gun blow-drying, and then a pre-baking treatment is performed.

In FIG. 6C, a silver nanowire layer 608 is disposed on the adhesion promotion layer 606.

The "metal nanowires" used herein is a collective term, which refers to a collection of metal wires including a plurality of element metals, metal alloys, or metal compounds (including metal oxides), and the number of metal nanowires included therein does not affect the scope protected by the present disclosure. In addition, at least one dimension of a cross-section (i.e., the diameter of the cross-section) of a single metal nanowire is less than about 500 nm, preferably less than about 100 nm, and more preferably less than about 50 nm. The metal nanostructure called "wire" in the present disclosure has a high aspect ratio, for example, between about 10 and 100,000. More specifically, the aspect ratio (length:diameter of cross-section) of the metal nanowire can be greater than about 10, preferably greater than about 50, and more preferably greater than about 100. The metal nanowire can be any metal, including (but not limited to) silver, gold, copper, nickel, and gold-plated silver. If other terms, such as silk, fiber, tube, etc., also have the size and the high aspect ratio mentioned above, they are also within the scope protected by the present disclosure. In one embodiment, the silver nanowire layer 608 is prepared by coating a coating composition including silver nanostructures. In order to form the coating composition, the silver nanowires are generally dispersed to form a silver nanowire ink/dispersion for facilitating the coating process. It should be understood that any suitable liquid that forms stable silver nanowire dispersion can be used as described herein. Preferably, the silver nanowires are dispersed in water, alcohol, ketone, ether, hydrocarbon, or aromatic solvents (benzene, toluene, xylene, etc.). More preferably, the liquid has volatility and a boiling point not greater than 200° C., not greater than 150° C., or not greater than 100° C. After the curing/drying step, the substances, such as solvent, in the slurry are volatilized, while the metal nanowires are distributed on the surface of the substrate in a random manner, and the metal nanowires can contact with each other to provide a continuous current path, thereby forming a conductive network.

In addition, a film layer may be coated, such that the film layer forms a composite structure with the metal nanowires, and the composite structure has certain specific chemical, mechanical, and optical properties, such as an adhesion between the metal nanowires and the substrate, or a better physical mechanical strength. Therefore, the film layer can be called matrix. On the other hand, under the condition that some specific polymers are used to produce the film layer such that the metal nanowires have an additional surface protection against scratches and abrasion, the film layer can be called a hard coat or an overcoat. For example, polyacrylate, epoxy resin, polyurethane, polysilane, polysiloxane, poly(silicone-acrylate), etc. allow the metal nanowires to have a higher surface strength, thereby improving the scratch resistance. Furthermore, the film layer can be added with UV stabilizers, so as to improve the UV resistance of the metal nanowires. However, those mentioned above are only for illustrating the possibility of other additional functions/names of the film layer and are not intended to limit the present disclosure.

After that, the device can be subject to a patterning process, including steps such as pattern exposure, development, and etching, so as to form the copper layer 604, the silver nanowire layer 608, or both of the copper layer 604 and the silver nanowire layer 608 into a circuit pattern. The adhesion promotion layer 606 can be etched in the step of etching the copper layer 604 or etching the silver nanowire layer 608. Alternatively, the copper layer 604, the silver nanowire layer 608, and the adhesion promotion layer 606 can be etched in a same etching step.

In another embodiment, the sequence of the manufacturing process can be adjusted. For example, the silver nanowire layer 608 is formed first, and the adhesion promotion layer 606 and the copper layer 604 are formed subsequently.

The following is a confirmation of the implementations including comparative examples and experimental examples of the present disclosure. After forming a stacked structure including a copper layer and a silver nanowire layer, and the stacked structure is subjected to an adhesion test (i.e., peeling strength test). Specific experiment results are shown in Table 1. The ratios shown in Tables 1 to 3 are the weight percentages of the content of the base solution and the additive included in the overall weight of the composite formulated organic coating material. Scheme 1 is a combination of 3-glycidoxypropyltrimethoxysilane (i.e., the base solution) and EDTA (i.e., the additive). Scheme 2 is a combination of 3-glycidoxypropyltrimethoxysilane (i.e., the base solution) and phenylaminomethyltriethoxysilane (i.e., the additive). Scheme 3 is a combination of tetrakis(trimethylsiloxy)silane (i.e., the base solution) and 4'-diphenylmethane diisocyanate (i.e., the additive).

TABLE 1

| | Adhesion test* | | | | |
| --- | --- | --- | --- | --- | --- |
| Scheme 1 | w/o treatment | 0.1 wt % | 0.5 wt % | 1 wt % | 1.33 wt % |
| | 0B | 3B | 4B | 4B | 4B |
| Scheme 2 | w/o treatment | 0.1 wt % | 0.5 wt % | 1 wt % | 1.5 wt % |
| | 0B | 3B | 3B | 4B | 4B |
| Scheme 3 | w/o treatment | 0.1 wt % | 0.5 wt % | 1 wt % | 1.5 wt % |
| | 0B | 3B | 4B | 4B | 4B |

*ASTM D3359 test standard is adopted herein, the content of ASTM D3359 can be introduced herein as the specific test tools/methods/steps.

The following is a confirmation of the implementations, including comparative examples and experimental examples of the present disclosure. After forming a stacked structure including a copper layer and a silver nanowire layer, the stacked structure is soaked in a common striping liquid of "tetramethylammonium hydroxide (TMAH)" or "$Na_2CO_3$" of the development process, and then an adhesion test (i.e., peeling strength test) between the silver nanowire layer and the copper later is performed. Specific experiment results are shown in Tables 2 and 3.

TABLE 2

Adhesion test after being soaked in TMAH

| Scheme 1 | 0.1 wt %<br>3B | 0.5 wt %<br>4B | 1 wt %<br>4B | 1.33 wt %<br>4B |
|---|---|---|---|---|
| Scheme 2 | 0.1 wt %<br>3B | 0.5 wt %<br>4B | 1 wt %<br>4B | 1.5 wt %<br>4B |
| Scheme 3 | 0.1 wt %<br>3B | 0.5 wt %<br>4B | 1 wt %<br>4B | 1.5 wt %<br>4B |

TABLE 3

Adhesion test after being soaked in $Na_2CO_3$

| Scheme 1 | 0.1 wt %<br>3B | 0.5 wt %<br>4B | 1 wt %<br>4B | 1.33 wt %<br>4B |
|---|---|---|---|---|
| Scheme 2 | 0.1 wt %<br>3B | 0.5 wt %<br>4B | 1 wt %<br>4B | 1.5 wt %<br>4B |
| Scheme 3 | 0.1 wt %<br>3B | 0.5 wt %<br>4B | 1 wt %<br>4B | 1.5 wt %<br>4B |

Table 4 shows the results of the adhesion test between the copper layer and the silver nanowire layer applying the above-mentioned adhesion promotion layer. In Schemes 4 and 5, the epoxy-based silane coupling agent (i.e., the base solution) is selected from the following chemicals.

The amine-based silane coupling agent (i.e., the additive) used in Scheme 4 is N-2 aminoethyl-3-aminopropyltrimethoxysilane. The organic resin (i.e., the additive) used in Scheme 5 is polyurethane. The ratios (AP ratio) shown in Table 4 are the weight percentages of the content of the base solution and the additive contained in the overall weight of the composite formulated organic coating material.

TABLE 4

| Scheme | Formulation | AP ratio | Result |
|---|---|---|---|
| Scheme 4 | AK14<br>(Epoxy:Amine = 1:4) | 1% | 3B |
| Scheme 5 | AP101<br>(Epoxy:PU = 10:1) | 1.1% | 3B |

It can be seen that in the stacked structure of the copper layer and the silver nanowire layer, when being treated with the stripping solution, the adhesion promotion layer can provide a significant effect of improving the adhesion. Therefore, no matter whether under a general condition (without being soaked in the stripping solution) or a condition of being soaked in the stripping solution, an adhesive force of 3B or more (for example, test results of 3B, 4B, 5B) between the silver nanowire layer and the copper layer can be maintained.

In one embodiment, the components of the coating material are combined by chemical reaction, such that the affinity is improved, thereby improving the effect of the composite material. The base solution is a first coupling agent. The additive is a second coupling agent, an organic ligand, an organic resin, or a combination thereof. The first coupling agent is different from the second coupling agent.

In one embodiment, the functional groups at both ends of the structure of the coupling agent react with the dispersed phase of the film layer or the matrix respectively, and the coupling effect varies greatly due to the difference of groups. The coupling agent is, for example, epoxy-based silane coupling agent, amine-based silane coupling agent, etc.

The organic ligand is, for example, a chelating agent, wherein the coordinating atoms in the chelating agent are oxygen atoms, nitrogen atoms, sulfur atoms, phosphorus atoms, arsenic atoms, etc. The organic ligand can effectively react with the functional groups at both ends of the coupling agent for forming bonding.

The embodiments of the present disclosure can solve the peeling problem of the contact structure, such that the device including this contact structure can be produced by the yellow-light process and has a high reliability. By adopting a production method of yellow-light process to manufacture an electronic device including conductive film layers, it is possible to provide a better time efficiency and reduce the production cost.

Although the content of the present disclosure has been disclosed above by means of embodiments, it is not intended to limit the present disclosure. Any one skilled in the art can make various changes and modifications without departing from the spirit and scope of the present disclosure. Therefore, the scope protected by the present disclosure shall defined by the appended claims.

What is claimed is:

1. A contact structure, comprising:
a substrate;
a copper layer disposed over the substrate;
an adhesion promotion layer disposed over the copper layer, wherein the adhesion promotion layer comprises an organic material and forms a monomolecular adsorption layer on a surface of the copper layer; and
a silver nanowire layer disposed over the adhesion promotion layer, wherein an adhesive force between the copper layer and the silver nanowire layer is 3B or more measured by test method ASTM D3359.

2. The contact structure according to claim 1, wherein the adhesion promotion layer is an organic layer formed by curing a composite formulated organic coating material, and the composite formulated organic coating material comprises 0.05 wt % to 10 wt % of a base solution, 0.05 wt % to 10 wt % of an additive, and 80 wt % to 99.8 wt % of a solvent.

3. The contact structure according to claim 2, wherein the base solution is a first coupling agent, the additive is a second coupling agent, an organic ligand, an organic resin, or a combination thereof, and the first coupling agent is different from the second coupling agent.

4. The contact structure according to claim 3, wherein the first coupling agent is an epoxy-based silane coupling agent, and the second coupling agent is an amine-based silane coupling agent.

5. The contact structure according to claim 3, wherein a content of the base solution and the additive is 0.1 wt % to 1.5 wt % of an overall weight of the composite formulated organic coating material.

6. The contact structure according to claim 3, wherein a ratio of the base solution to the additive is 1:4 to 10:1.

7. The contact structure according to claim 1, wherein the adhesion promotion layer has a thickness of about 50 nm to about 100 nm.

8. The contact structure according to claim 1, wherein the contact structure has an adhesive force of 3B to 4B measured by test method ASTM D3350 after being soaked in tetramethylammonium hydroxide.

9. An electronic device comprising the contact structure according to claim 1.

10. The electronic device according to claim 9, wherein the contact structure is located in a peripheral area of the electronic device.

11. A contact structure, comprising:
a substrate;
a copper layer disposed on the substrate;
an adhesion promotion layer disposed on the copper layer, wherein the adhesion promotion layer comprises an organic material and forms a monomolecular adsorption layer on a surface of the copper layer; and
a silver nanowire layer disposed on the adhesion promotion layer, wherein the silver nanowire layer comprises nanowires and a film layer to define a composite.

12. The contact structure of claim 11, wherein the copper layer is disposed over the substrate, the adhesion promotion layer is disposed over the copper layer, and the silver nanowire layer is disposed over the adhesion promotion layer.

13. The contact structure of claim 11, wherein the adhesion promotion layer is in contact with a first sidewall of the copper layer and is not in contact with a second sidewall of the copper layer.

* * * * *